United States Patent
Nishizawa et al.

(10) Patent No.: US 8,214,184 B2
(45) Date of Patent: Jul. 3, 2012

(54) REVERSE ENGINEERING BASED COIL SPRING DESIGN METHOD

(75) Inventors: Shinichi Nishizawa, Novi, MI (US); Tadashi Sakai, Novi, MI (US)

(73) Assignee: NHK International Corp., Wixom, MI (US)

(*) Notice: Subject to any disclaimer, the term of this patent is extended or adjusted under 35 U.S.C. 154(b) by 528 days.

(21) Appl. No.: 11/875,229

(22) Filed: Oct. 19, 2007

(65) Prior Publication Data

US 2009/0106006 A1  Apr. 23, 2009

(51) Int. Cl.
- G06G 17/50 (2006.01)
- G06G 7/48 (2006.01)
- F16F 1/06 (2006.01)

(52) U.S. Cl. .......... 703/7; 703/1; 267/166; 267/175; 267/180

(58) Field of Classification Search .......... 703/1, 7; 267/166, 175, 177, 180

See application file for complete search history.

(56) References Cited

U.S. PATENT DOCUMENTS

| | | | |
|---|---|---|---|
| 5,243,746 A * | 9/1993 | Shinichi | 140/71.5 |
| 6,631,647 B2 | 10/2003 | Seale | |
| 7,434,458 B2 * | 10/2008 | Nishizawa et al. | 73/161 |
| 7,606,690 B2 * | 10/2009 | Nishizawa et al. | 703/8 |
| 2004/0169322 A1* | 9/2004 | Ogura et al. | 267/180 |
| 2005/0245142 A1* | 11/2005 | Kister | 439/817 |
| 2009/0093988 A1* | 4/2009 | Baranski et al. | 702/108 |

FOREIGN PATENT DOCUMENTS

| | | | |
|---|---|---|---|
| JP | 08303507 A | * | 11/1996 |
| KR | 10-0591278 B1 | | 6/2006 |
| WO | WO 98-53933 A1 | | 12/1998 |

OTHER PUBLICATIONS

"On the natural frequencies of helical compression springs", Becker et al. International Journal of Mechanical Sciences. Nov. 13, 2001.*
"A linear approximation model for the parameter design problem", Yahya Fathi. European Journal of Operations Research. Jul. 10, 1996.*
"Boundary Element Method for Quasi-Harmonic Differential Equation With Application to Stress Analysis and Shape Optimization of Helical Spring". Kamiya, N. et al. Sep. 11, 1989.*
International Search Report from corresponding PCT application No. PCT/US2008/011588, dated Oct. 8, 2008, 4 pages.
International Written Opinion from corresponding PCT application No. PCT/US2008/011588, dated Oct. 8, 2008, 6 pages.
International Preliminary Report on Patentability (Chapter I) and Written Opinion from corresponding PCT application No. PCT/US2008/011588, dated Apr. 29, 2010, 8 pages.

* cited by examiner

*Primary Examiner* — Kandasamy Thangavelu
*Assistant Examiner* — Nithya Janakiraman
(74) *Attorney, Agent, or Firm* — Brinks Hofer Gilson & Lione

(57) ABSTRACT

A finite element analysis (FEA) based coil spring design method that utilizes a reverse engineering based concept. The method involves first designing a desired jounce profile, which is typically an output in the conventional FEA based design, and then reversely determining the corresponding free profile necessary for manufacturing a spring having desired performance specifications.

11 Claims, 13 Drawing Sheets

FIG - 14B  FIG - 14C

REVERSE ENGINEERING BASED COIL SPRING DESIGN METHOD

TECHNICAL FIELD

The present invention relates to general coil. More particularly, the present invention is directed to a method for the automated, optimized and designer-independent design of coil springs, which produces ideal spring shape.

BACKGROUND ART

Traditionally, coil springs are designed based upon simple statics with Wahl's correction factor to compensate stress for the effect of curvature. However, this theory was derived with an assumption of zero pitch angle throughout the spring. As high strength materials were developed, coil springs were intentionally designed with fewer turns to efficiently utilize the capability of the newer high strength materials. As a result, the pitch angle of coil springs increased and the statics based simple calculations no longer provided design results with sufficient accuracy.

In 1990, Finite Element Analysis (FEA) based coil spring design, including an estimation of the spring Force Line Position (FLP—the intersection point between spring seat plane and spring reaction force vector), became popular as a way of meeting the increasing demand for higher design accuracy. Increasing computer speeds helped further the application of FEA to coil spring design methods. Since FEA is a non-reversible computation, an FEA model of a spring consisting of height and radius distribution must be created under the spring's unloaded (free) condition. The spring model is then compressed using FEA to check if the spring characteristics satisfy all design requirements such as rate, load, FLP, stress, deformed profile, etc. If the FEA results do not satisfy the design specification requirements, the free profile is modified by predicting the effect of the modification on the spring characteristics at the deformed state, as shown in FIG. 1. This modification is conducted by a designer who, through extensive experience, develops a sense of how a particular modification should effect a desired change.

The conventional FEA based coil spring design process requires extensive skill and experience for rapid and optimized design. Because of this, the resultant free profile depends on the individual designer and it is difficult to duplicate the same design every time, even by the same designer with the same requirements.

While the FEA based coil spring design method provides more ability for problem assessment at the design stage, it exacerbates design difficulties and promotes designer-dependent designs.

The present invention provides a designer-independent, rapid and robust FEA based coil spring design method as well as ideal spring shape.

DISCLOSURE OF THE INVENTION

According to various features, characteristics and embodiments of the present invention which will become apparent as the description thereof proceeds, the present invention provides a computerized method of designing a coil spring at an free condition which spring will demonstrate desired spring characteristics when compressed, which method involves the steps of:

a) determining desired design compressed characteristics of a coil spring, including at least a designed jounce profile and a designed force line position;

b) choosing an initial free coil spring profile;

c) compressing the free coil spring profile using finite element analysis to obtain compressed profiles;

d) comparing the characteristics of the compressed spring in step c) with the desired design compressed characteristics in step a) and:

e) repeating steps c) and d) after making an adjustment to the previous uncompressed spring profile until the characteristics of the compressed spring profile in step c) are within acceptable tolerances of the desired design compressed characteristic in step a).

The present invention further provides a method of designing a coil spring at a free condition which spring will demonstrate desired spring characteristics when compressed, which method involves the steps of:

a) determining desired design compressed characteristics of a coil spring, including at least a designed jounce profile and a designed force line position;

b) choosing an initial free coil spring profile;

c) compressing the free coil spring profile using finite element analysis (FEA) to obtain compressed profiles;

d) comparing the resultant jounce profile with the designed jounce profile;

e) repeating steps c) and d) after making an adjustment to the previously uncompressed spring profile until the resultant jounce profile in step d) is within acceptable tolerances from the designed jounce profile;

f) comparing the force line position of the compressed spring profile with the designed line force position;

g) repeating steps c) and f) after making an adjustment to the previously uncompressed spring profile until the force line position in step f) is within acceptable tolerances of the design force line position; and h) repeating steps c)-g) until the jounce profile in step d) is within acceptable tolerances of the designed jounce profile and the force line position in step f) is within acceptable tolerances of the design force line position.

The present invention further provides coil springs that are produced by the design methods, which coil springs have ideal shape in terms of stress and weight.

BRIEF DESCRIPTION OF DRAWINGS

The present invention will be described with reference to the attached drawings which are given as non-limiting examples only, in which:

FIG. 14b illustrates a side view of the free profile with the coil center line of a spring designed according to the present invention.

FIG. 14c illustrates a top view of the free profile with the coil center line of a spring designed according to the present invention.

BEST MODE FOR CARRYING OUT THE INVENTION

The present invention is directed to a method for the automated, optimized and designer-independent design of coil springs. The method of the present invention involves a new concept for FEA based coil spring design that utilizes a reverse engineering based concept that involves first designing a desired jounce profile, which is typically an output in the conventional FEA based design, and then reversely determining the corresponding free profile necessary for manufacturing a spring having desired performance specifications. As used herein, Jounce height is the height of a spring when the spring is compressed the most and Jounce profile is the spring profile at jounce height.

According to the present invention the ideal deformed spring profile is designed first and its corresponding unique free profile is then reversely determined by automated FEA iterations in order to satisfy the design/specification requirements. By scanning the total number of turns in a certain range for the deformed spring profile designed at the first stage, the optimal spring design can be selected in terms of weight, stress and manufacturability.

The method of the present invention eliminates designer-subjectiveness that can result in a difficulty of design repeatability as well as designer-dependent design. In addition, the method of the present invention achieves an optimal spring design from the standpoint of stress, weight, and deformed shape. Furthermore, the method of the present invention provides an automated design system that can be easily operated by persons who do not have extensive training or experience in coil spring design.

Typical requirements for automobile coil springs include a desired spring rate, load, and FLP (all at 1G height), no coil-to-coil contact throughout spring travel (especially at Jounce height) and no interference with other components around the spring (especially at Jounce height).

All of the requirements are specified under compressed conditions of the spring and not at the free condition. Therefore, the present inventors theorized that it would be better for designers to first design the ideal jounce profile and then determine the free profile corresponding to the designed jounce profile as a way of satisfying all of the requirements. In theory, if the jounce profile and spring reaction force vector are fixed under a certain number of coils, a unique corresponding free profile exists. The present invention is directed to a method that reversely determins the free profile realizing the designed ideal jounce profile with a unique algorithm for FLP adjustment based on automated FEA iteration.

Figure 1:
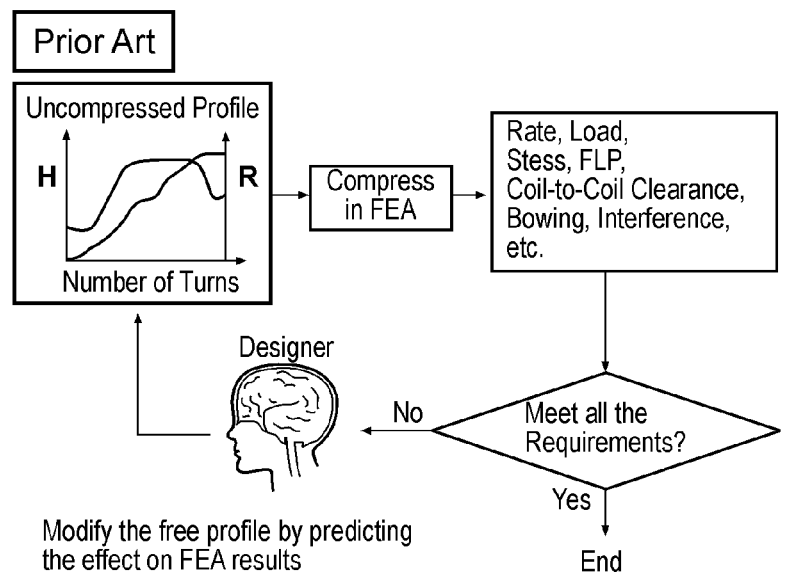
FIG. 1 is a flowchart that illustrates a traditional process for designing coil springs.
Figure 2:
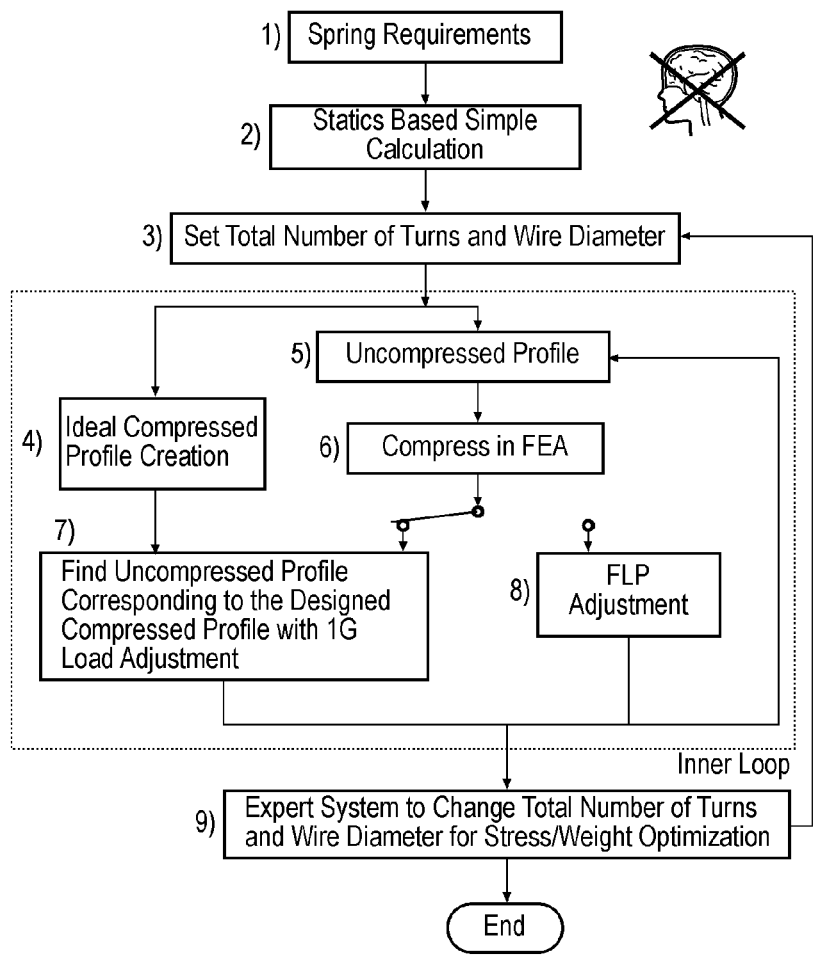
FIG. 2 is a flowchart that illustrates a process for designing coil springs according to one embodiment of the present invention.

FIG. 2 is a flowchart that illustrates the steps for designing coil springs according to one embodiment of the present invention. FIG. 2 shows the overall design flow of the present method. First, the initial total number of turns and wire diameter of a coil spring are determined by statics based simple calculations with the Wahl's stress correction factor to meet the target spring requirements as illustrated in blocks 1-3 in FIG. 2. The ideal jounce profile shown in block 4 in FIG. 2 is designed based on the dimensional information and spring packaging space requirements while maximizing the coil-to-coil clearance.

Meanwhile, an arbitrary initial free profile (see block 5) is automatically created without concern for spring characteristics based on the basic dimensional information obtained in the blocks 1-3 in FIG. 2. This initial free profile which could be similar to an initial profile used by traditional designers will be corrected during optimization in the design loop as discussed below.

In the next step shown in block 7 of FIG. 2 the initial free profile is compressed to the jounce (or compressed) condition in FEA and is subsequently corrected by comparing the deformed jounce profile to the designed ideal jounce profile with 1G load adjustment. After the free profile corresponding to the ideal jounce profile is determined, the process is switched to the FLP adjustment in block 8. Due to profile modifications in this step (block 8), the jounce profile may be altered from the ideal jounce profile. Accordingly, the steps represented in blocks 7 and 8 are repeated alternatively until both the free profile corresponding to the ideal jounce profile and the FLP adjustment are satisfied.

As shown in FIG. 2, blocks 3-8 are included in an inner loop which is carried out under a fixed number of turns and specific wire diameter. In order to optimize the stress and weight, the method of the present invention can change the total number of turns and wire diameter depending on the FEA result in block 9.

Figure 3:
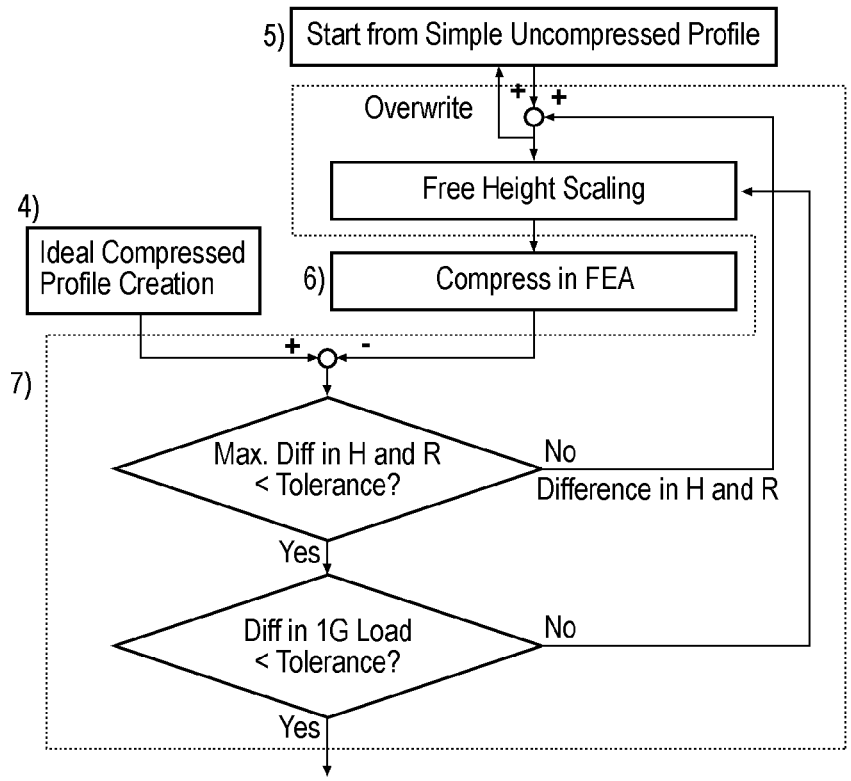
FIG. 3 is a detailed flowchart that illustrates how the jounce profile adjustment is performed according to one embodiment of the present invention.

FIG. 3 is a detailed flowchart that illustrates how the jounce profile adjustment is performed according to one embodiment of the present invention. Since the initial free profile is created automatically and arbitrarily, the compressed profile at jounce will be different from the designed ideal jounce profile for the first iteration. The difference in height and radius distribution of the compressed profile at jounce and the designed ideal jounce profile can individually be determined by subtracting the FEA result from the ideal jounce profile. The free profile is updated by superimposing this difference on it. At the same time, the free profile height is also scaled in order to adjust the resulting 1G load to the requirement. The amount of the scaling can be calculated based on the spring rate obtained from the FEA result. After modifying the free profile, it is again compressed using FEA. This process is iterated or repeated until both the jouce profile difference between ideal and FEA, and the 1G load difference between target and FEA satisfy predetermined desired tolerances.

Figure 4:
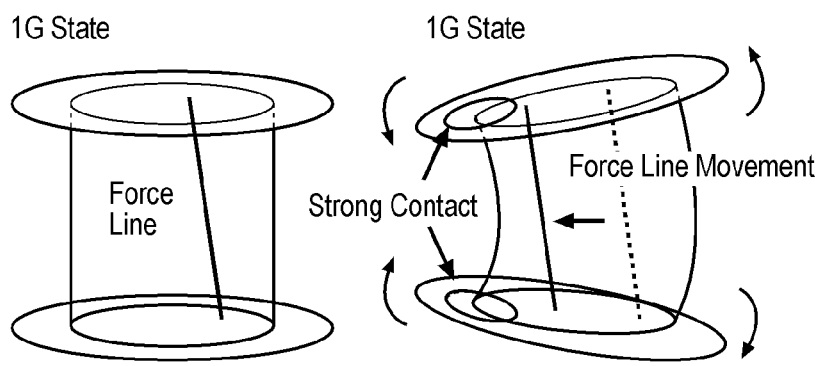
FIG. 4 illustrates movement tests by specific seat inclinations at 1G height.

FIG. 4 illustrates movement tests by specific seat inclinations at 1G height. Suppose the FLP requirement is given at 1G height. Since the FLP is approximately summerized as the center of pressure of the contact force between seat and coil, it can be adjusted by inclining the upper and the lower seat to change the contact force distribution at 1G height, as shown in FIG. 4.

For purposes of the present invention, FLP is expressed as a four-element vector, namely Upper-X, Upper-Y, Lower-X and Lower-Y.

$$P_i = [u_{xi}\ u_{yi}\ l_{xi}\ l_{yi}]$$

Where, the subscript i represents the condition of FLP as shown in Table 1.

TABLE 1

Representation of Subscript i

| i | Condition (1G Height) |
|---|---|
| 0 | Original FLP (without additional seat inclination) |
| 1 | Tested FLP with unit upper seat inclination about X-axis |
| 2 | Tested FLP with unit upper seat inclination about Y-axis |
| 3 | Tested FLP with unit lower seat inclination about X-axis |
| 4 | Tested FLP with unit lower seat inclination about Y-axis |
| t | Target FLP |

Figure 5:
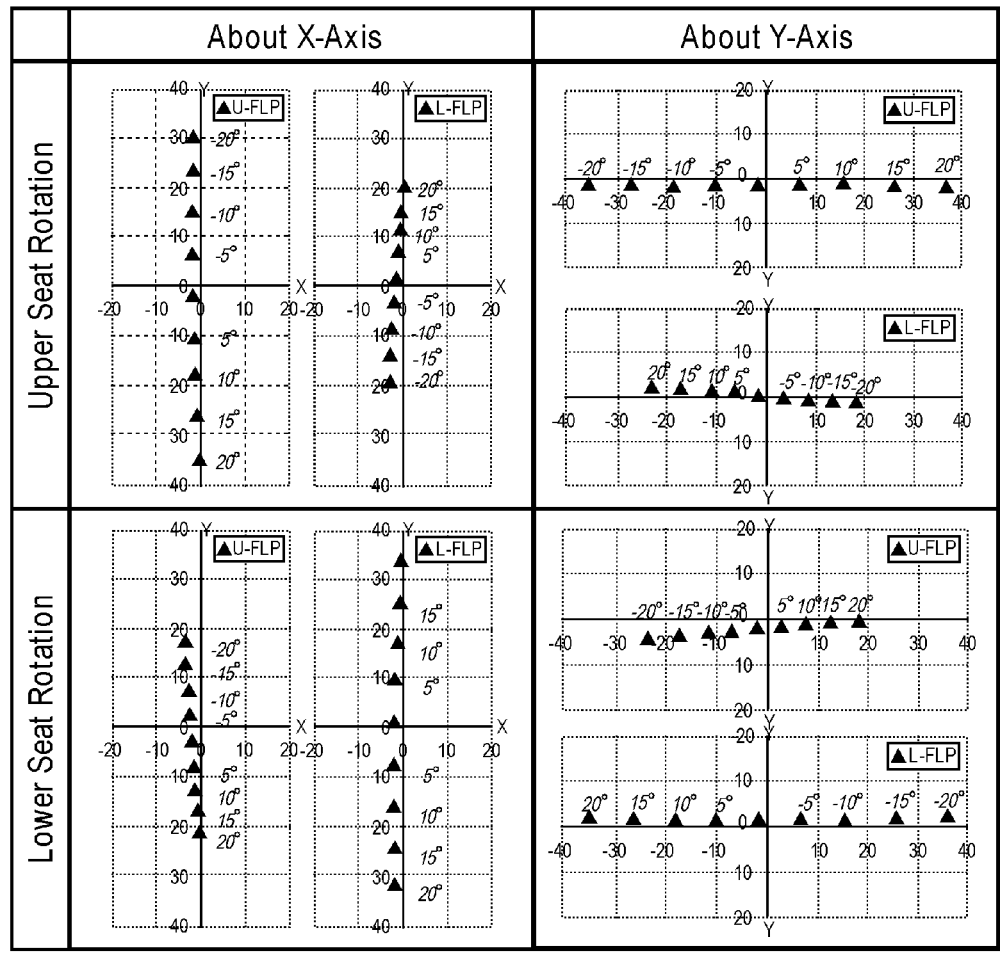
FIG. 5 depicts the relationship between seat inclination and FLP.

In order to check the relationship between the seat inclination and FLP movement during the course of the present invention, a pre-test was carried out with 5 degree rotation increments applied to the upper and the lower seat separately as shown in FIG. 5 which depicts the relationship between seat inclination and FLP. From the results, it can be concluded that the relationship can be approximated as a linear relationship.

This means that an amount of FLP movement can be estimated by scaling the results of the unit seat inclination. By testing how much the FLP moves with unit seat inclinations about X and Y axes, applied to the upper and the lower seat separately, the necessary seat inclination and its direction to move the current FLP to meet the target can be estimated by a linear combination of each unit seat inclination test result with weight $\theta_i$.

$$P_t = P_0 + \sum_{i=1}^{4} \theta_i \cdot \Delta P_i \quad (1)$$

Where, $\Delta P_i$ is the amount of FLP movement due to each unit seat inclination from the original FLP ($\Delta P_i = P_i - P_o$) and $\theta_i$ is the necessary seat inclination for the i'th condition.

Figure 6:
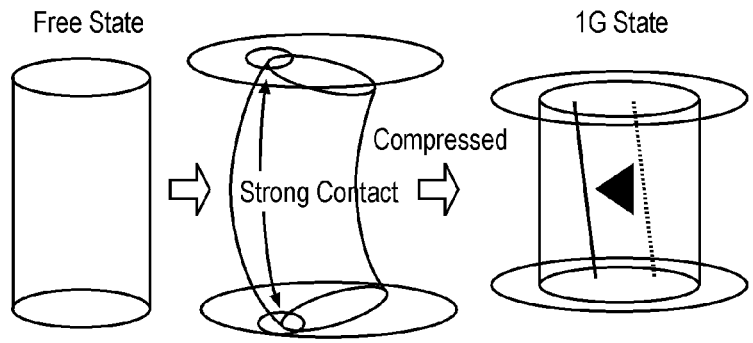
FIG. 6 depicts free profile modification based on estimated seat inclination obtained in FLP movement test at 1G height
Figure 7:
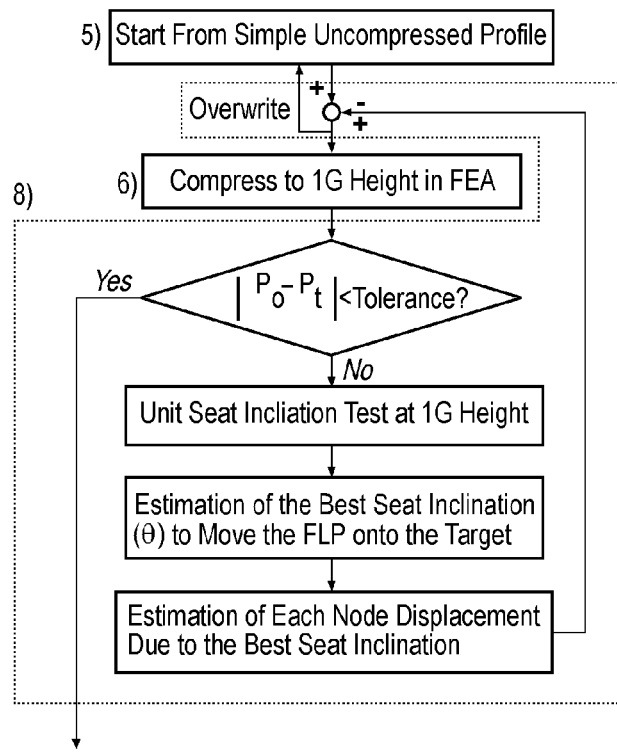
FIG. 7 is a detailed flowchart that illustrates how the FLP adjustment is performed according to one embodiment of the present invention.

Once the necessary seat inclinations are estimated by solving the system of linear equations (1) above, the displacement of each node on the spring due to the estimated seat inclination can be estimated by applying the same linear combination to the node movement as the unit seat inclination test. Each determined node displacement is then subtracted from the free profile so that it will deform oppositely from the seat inclination at 1G height. This means that the strong contact locations produced by the inclined seat shown in FIG. 5 which remain in the same location with the original seats. In other words, the contact force distribution produced by the seat inclination at 1G height should be partially realized by modifying the free profile without the need to incline the seats, as shown in FIG. 6 which depicts free profile modification based on estimated seat inclination obtained in FLP movement test at 1G height.

By iterating this FLP adjustment process, the FLP will eventually satisfy the target with a predetermined desired tolerance. The FLP adjustment flow is summarized as FIG. 6 which is a detailed flowchart that illustrates how the FLP adjustment is performed according to one embodiment of the present invention.

According to one embodiment of the present invention an expert system can be embedded in the process to modify the total number of turns and wire diameter effectively based on FEA results. In a simplified embodiment, the system can simply scan the total number of coils while changing wire diameter within a certain range. The best profile for each number of turns is determined in the design loop and one of the profiles will be selected from the standpoint of stress and weight.

Figure 8A:
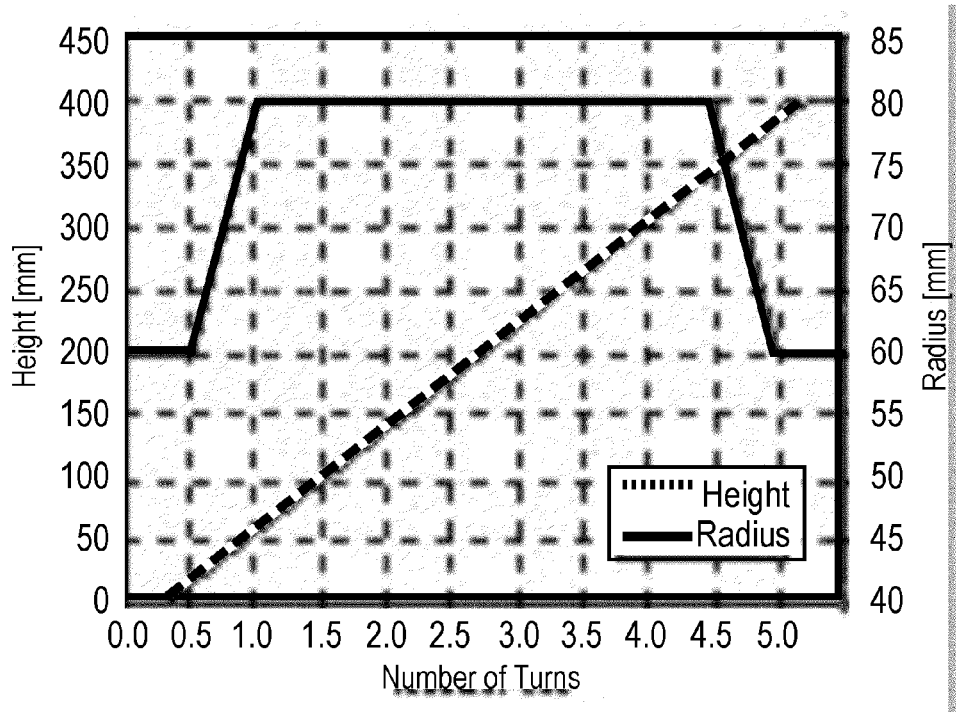
FIGS. 8a and 8b are prepared profiles at the start of a design iteration for an initial free profile (FIG. 8a) and a designed jounce profile (FIG. 8b).
Figure 8B:
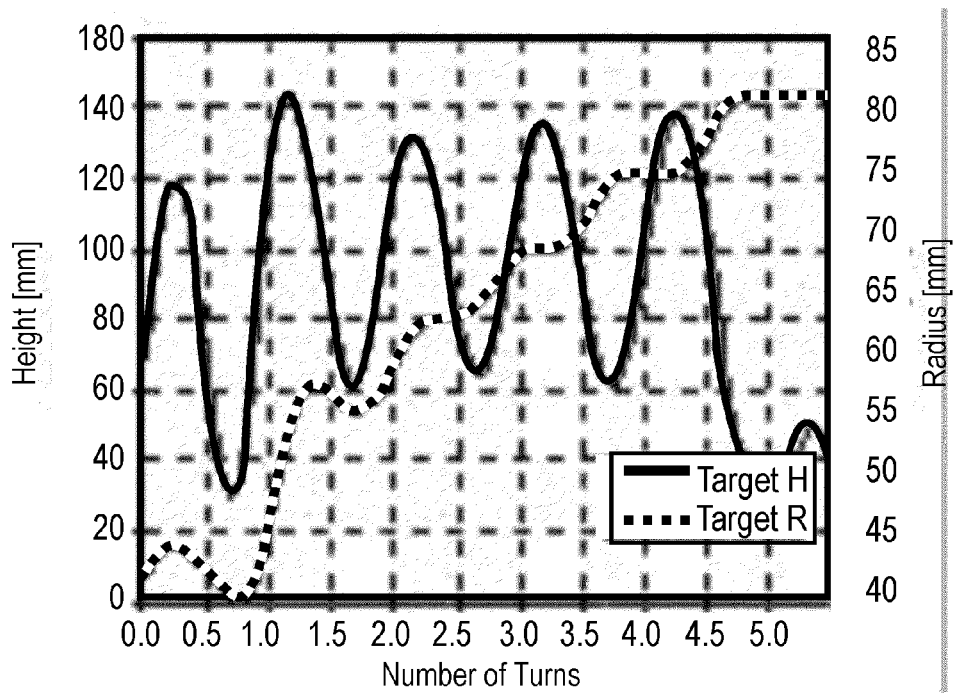

The following is an example of a spring that is designed using the present method. The profile adjustment process will first be demonstrated. The initial free profile and designed jounce profile are shown in FIGS. 8a and 8b which are prepared profiles at the start of a design iteration for an initial free profile (FIG. 8a) and a designed jounce profile (FIG. 8b). Since this example is for a strut application having an inclined and offset lower seat, the jounce profile was designed to follow the lower seat shape as well as maximizing the coil-to-coil clearance. That is the reason for the "wavy" profile shown in FIG. 8b.

Figure 9A:
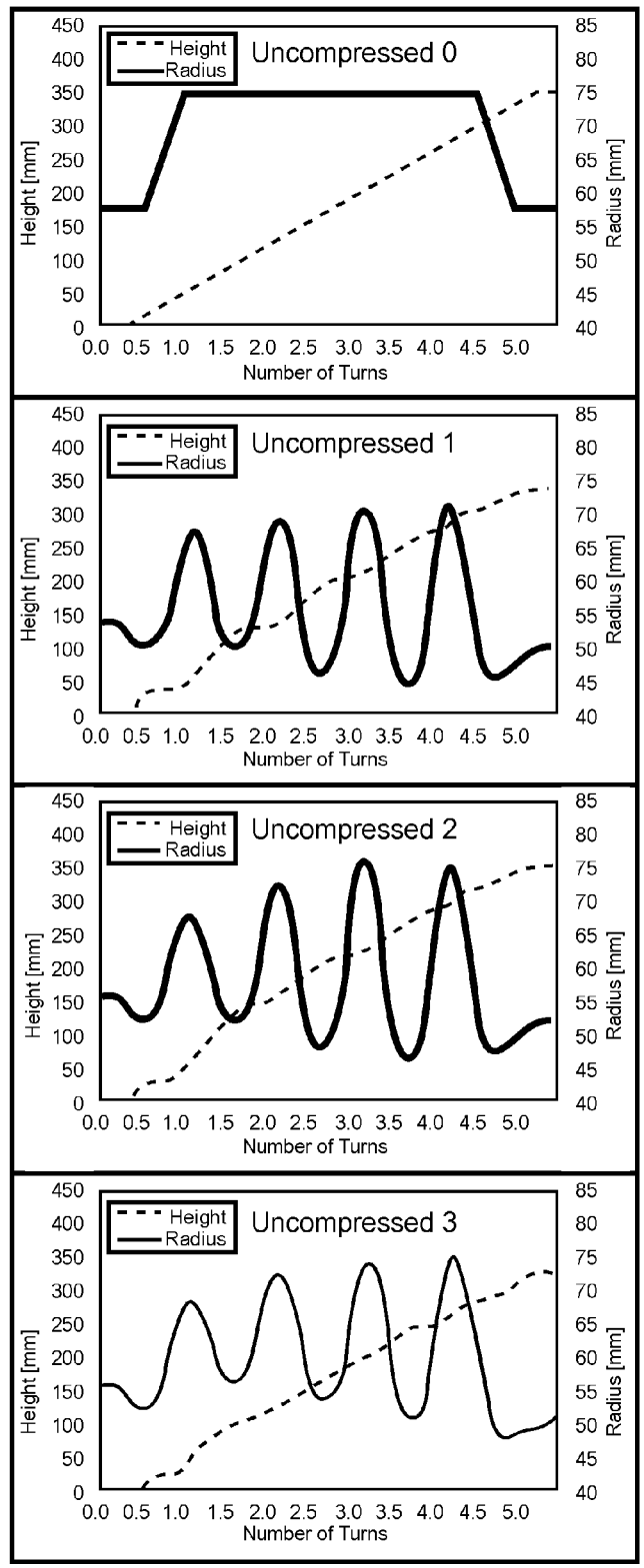
FIGS. 9a-9c progressively depict how the free profile is changed based on the difference in jounce profiles during an iteration process.
Figure 9B:
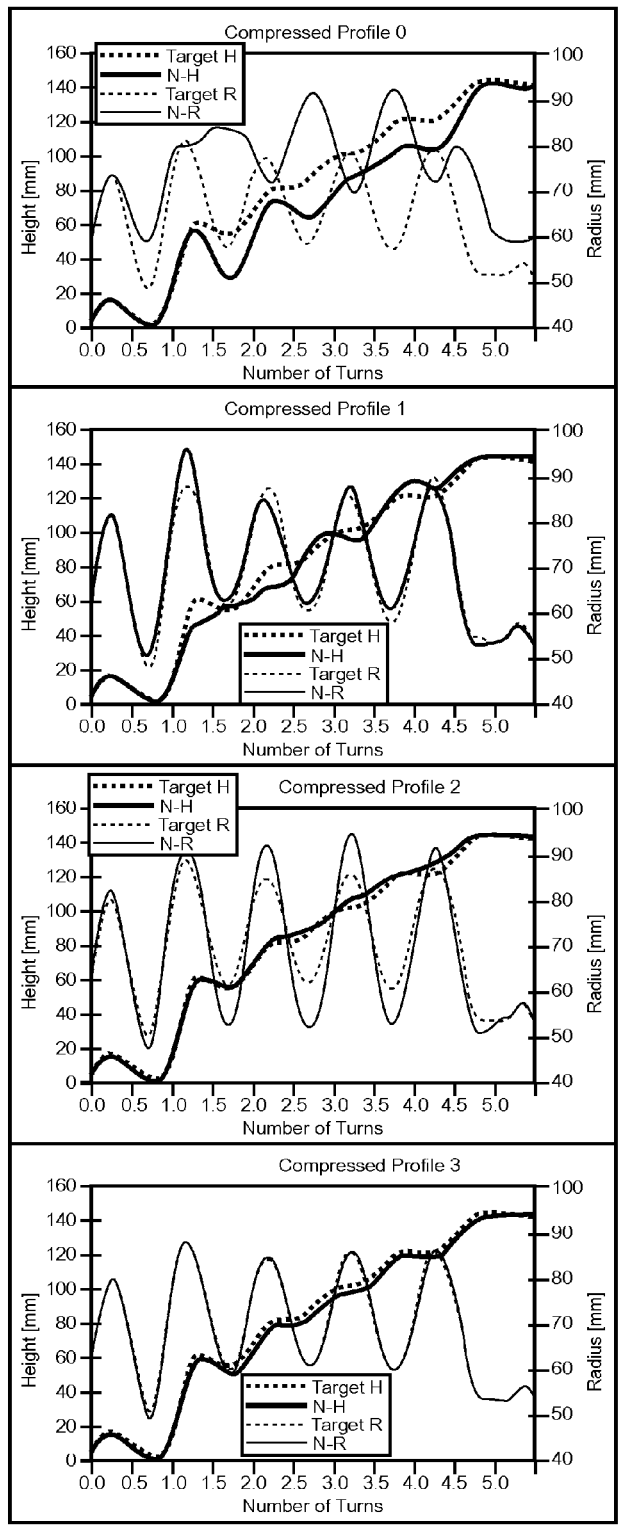
Figure 9C:
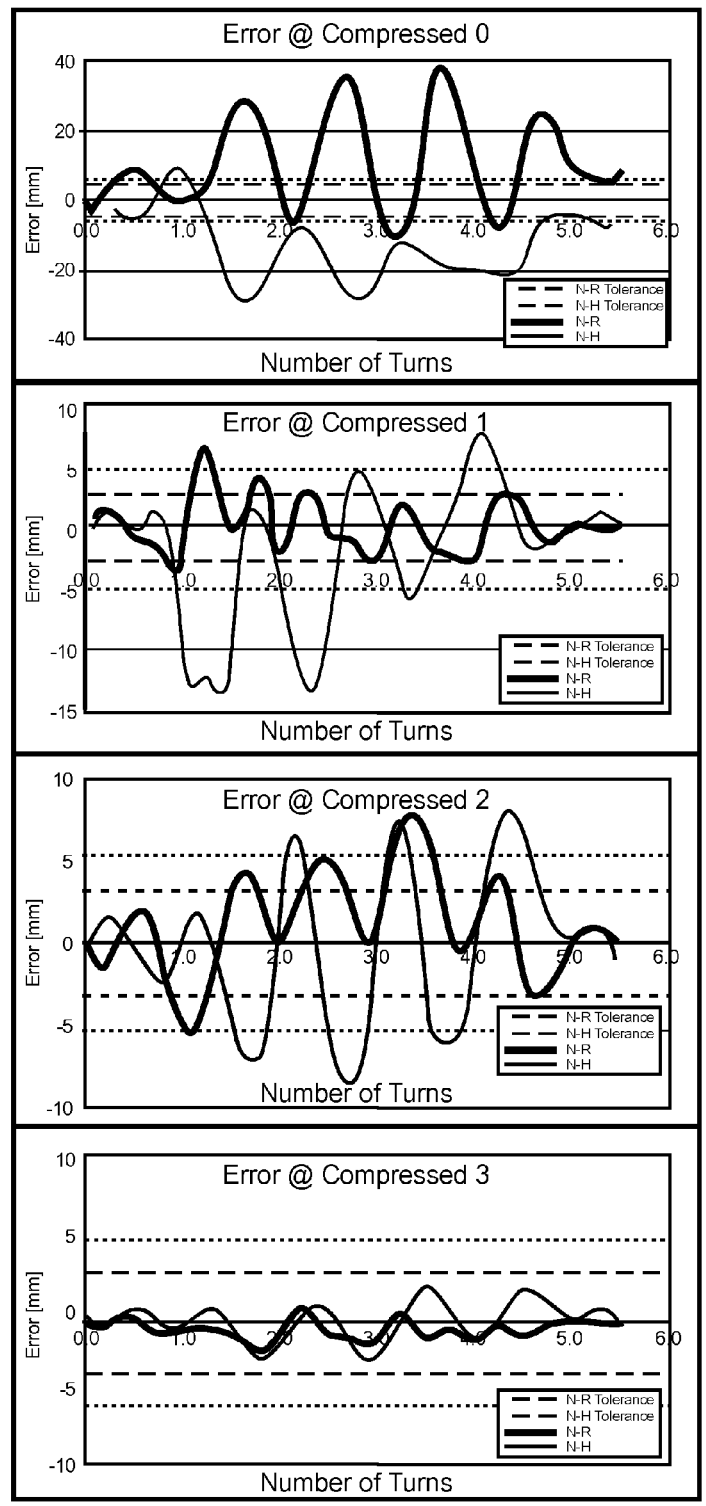

FIGS. 9a-9c progressively depict how the free profile is changed based on the difference in jounce profiles during an iteration process. As can be observed there is a large difference from the jounce profile in the first iteration that gradually converges as the number of iterations increases.

Figure 10:
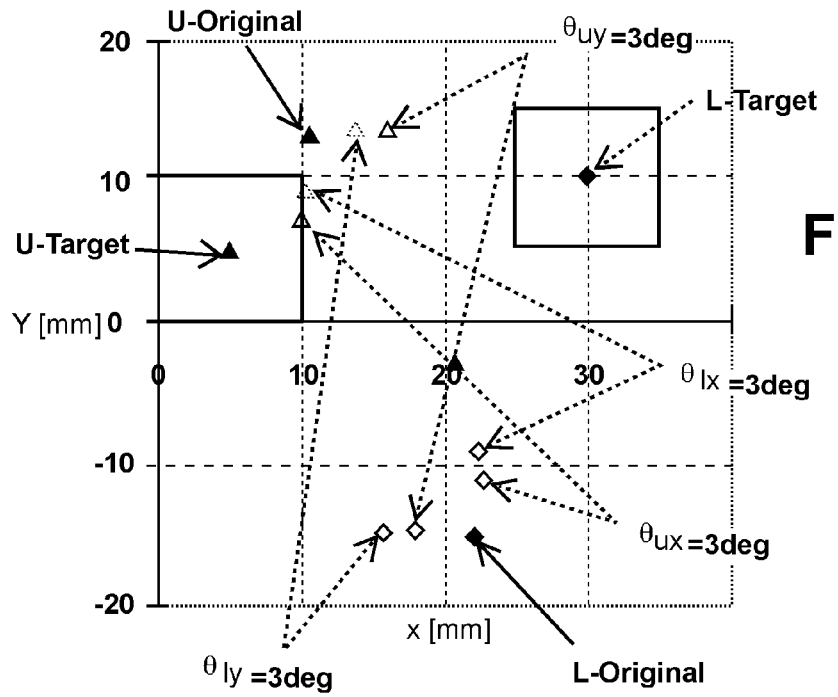
FIG. 10 depicts seat inclination test results at 1G height.

Once successive iterations have resulted in the free profile reaching the desired designed jounce profile, the process moves on to the FLP adjustment process. FIG. 10 shows seat inclination test results at 1G height. In order to enhance the FLP movement due to seat inclination, 3-degree seat rotations about the X and Y axes are applied in this case rather than a one degree (unit) seat inclination.

The linear combination of the above results produces the necessary seat inclinations to move the original FLP to the desired target. In this example, the seat inclinations are determined as follows;

$$\theta_i(i=1\sim4) = -8.5, -1.2, 18.4, -3.1 \text{ [deg]}$$

Figure 11:
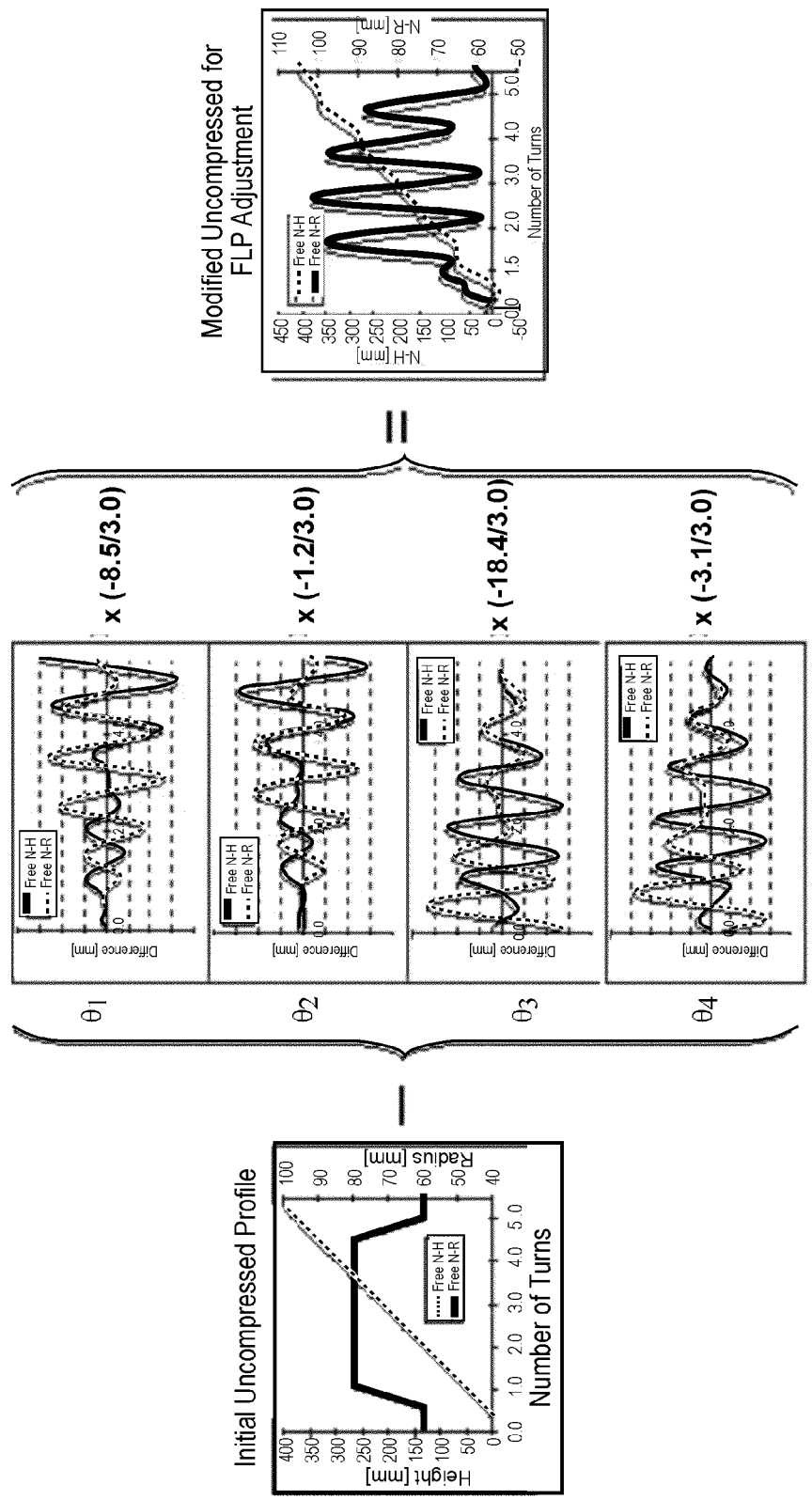
FIG. 11 depicts free profile modifications based on node displacement due to seat inclination.

Free profile modification based on node displacement due to the seat inclination from the first iteration of FLP adjustment is shown in FIG. 11. The modified free profile is then compressed to 1G height by following the flow shown in FIG. 8.

Figure 12:
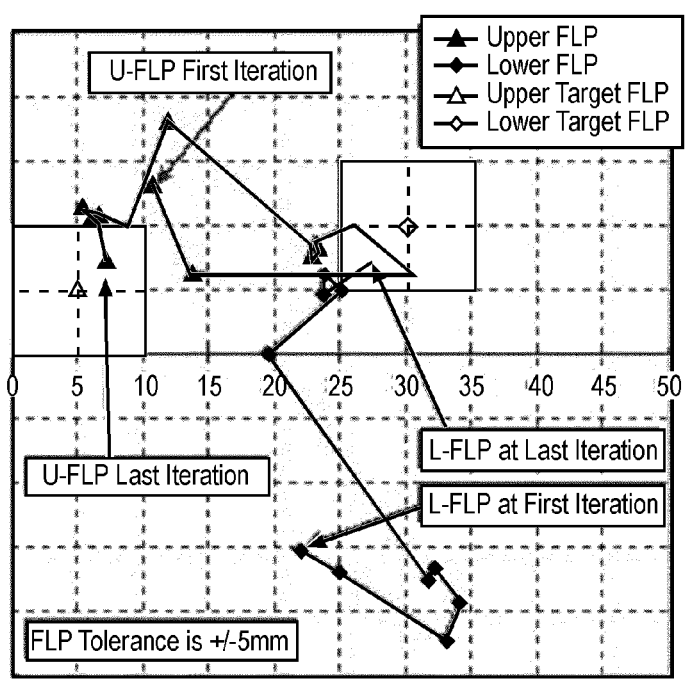
FIG. 12 depicts how the FLP moves during successive iterations.

FIG. 12 shows how the FLP moves during successive iterations. As can be seen in the illustrated example, the upper FLP and the lower FLP actually move away from their respective target values during the initial iterations, and eventually come within the illustrated acceptable tolerance values.

Figure 13:
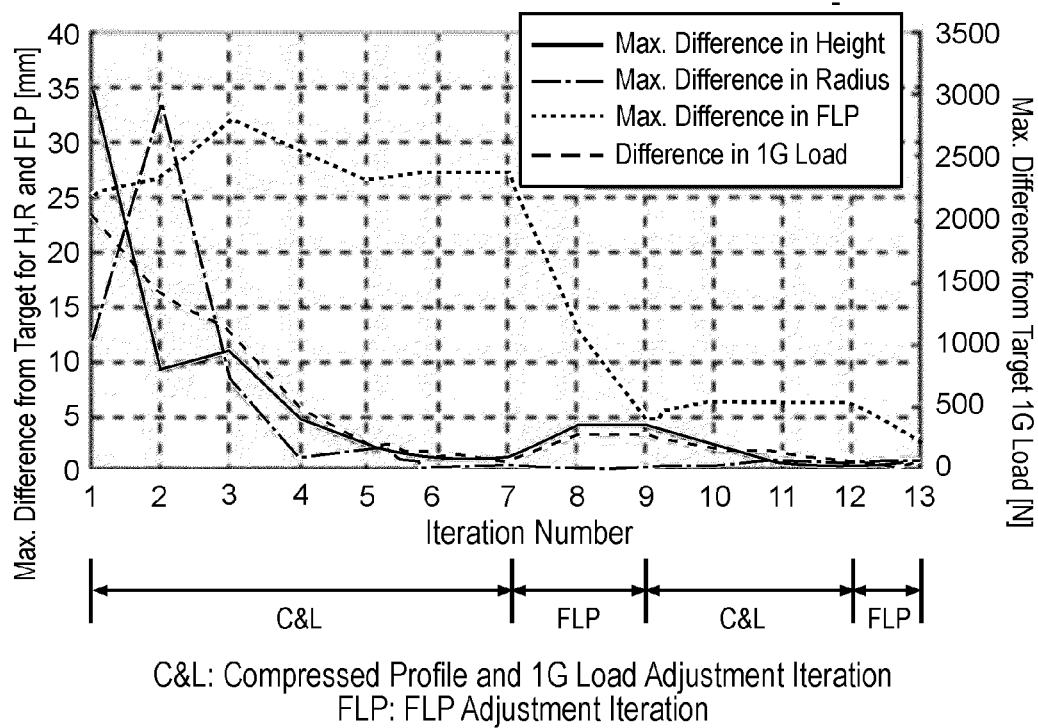
FIG. 13 depicts an example of the history of convergence for a spring design using the method of the present invention.

FIG. 13 shows the history of convergence of the entire system with the following criteria:
Jounce Height Tolerance: Target +/−1 mm
Jounce Radius Tolerance: Target +/−2 mm
1G Load Tolerance: Target +/−100 N
FLP Tolerance: Target +/−5 mm Because the method of the present invention adjusts the jounce profile and FLP separately, FLP can, as shown above, become worse during the jounce profile adjustment and vice versa. However, both will eventually converge to the desired target as the number of iterations increases. In the illustrated example, the entire design loop converged within three minutes computation time.

The resultant height/radius distribution and 3D free profile with center line and jounce condition are shown in FIGS. 14a-14d. The center line was determined by connecting the center points of three adjacent nodes on the spring. As can be seen, the free profile determined by the design method of the present invention does not have any notable geometrical features such as parameterizable curvature of coil center line, periodic radius and height distribution. However, the method produces a unique and optimal profile that realizes the optimally designed jounce profile while satisfying all other spring requirements. While the spring end is created by inclining the spring seat at 1G height, there is no requirement that the spring end plane be mathematically angled from the seat plane at the free condition. Rather, the configuration of the spring end will depend on how the spring end deforms on the seat during the unit seat inclination test. Therefore, the spring shape must always be given as a series of node position data points for radius and height distribution, rather than parameterized geometrical values. In this sense, the spring designed by the present inventive method differs from any other existing spring shapes.

Figure 14A:
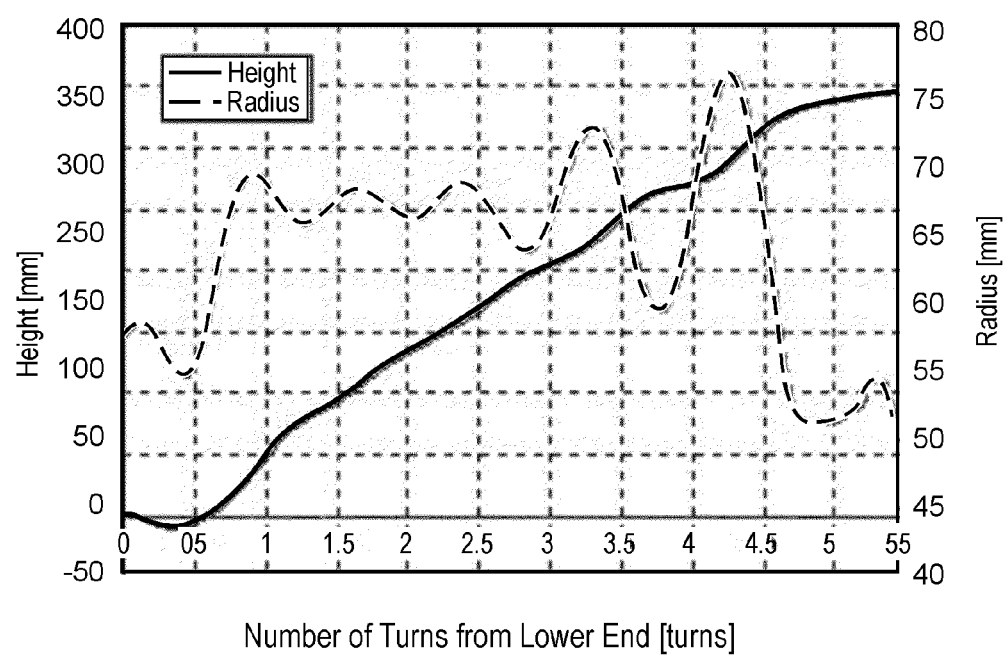
FIG. 14a illustrates the resultant height and radius distribution of a spring designed according to the present invention.
Figure 14D:
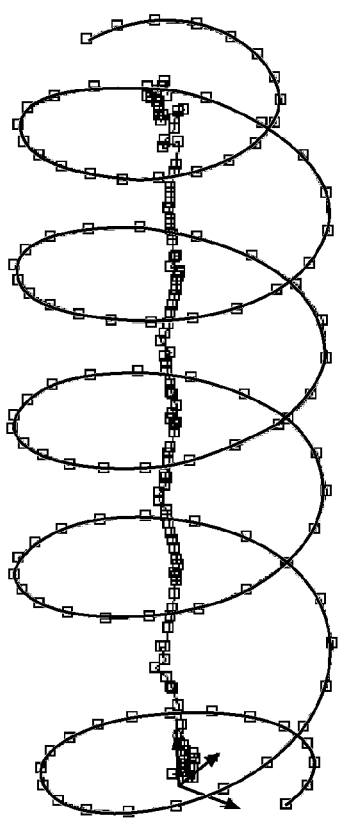
FIG. 14d illustrates a side view of the jounce condition of a spring designed according to the present invention.
Figure 14D:
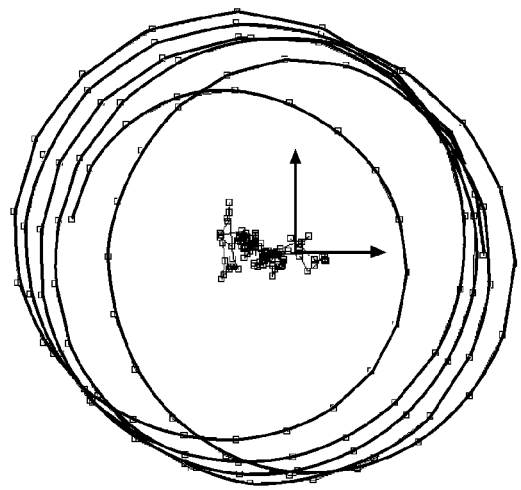
Figure 14D:
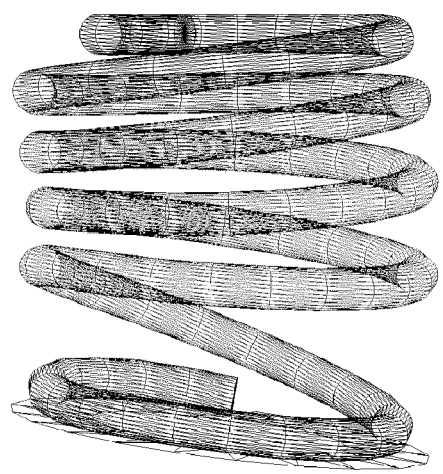

FIG. 14(d) shows the jounce profile compressed from the resultant free profile in FEA. Turns 0.75 to 1.25 from the lower end were intentionally designed with high pitch while the rest of the coil was designed to maximize coil-to-coil clearance, which matches exactly to the desired shape designed at the start of the design loop.

If an FLP is not specified in the requirements, coil-on-arm applications for example, the target FLP can tentatively be set to the center of the spring for the sake of even stress distribution. The method of the present invention can be extended to support more spring requirements in the design loop on demand, namely different packaging space requirement at different spring heights, manufacturability limitations, etc. The present method can be applied to spring designs for hot-coiling by eliminating the radius distribution feedback loop in the block 7 if the radius does not need to exactly follow the ideal jounce profile.

Although the present invention has been described with reference to particular means, materials and embodiments, from the foregoing description, one skilled in the art can easily ascertain the essential characteristics of the present invention and various changes and modifications can be made to adapt the various uses and characteristics without departing from the spirit and scope of the present invention as described above.

What is claimed is:

1. A computerized method of designing an uncompressed coil spring shape for quasi-static use to match pre-determined non-constant pitch and non-constant radius distributions in order to avoid interference with components adjacent the coil spring and adjacent spring wire of the coil spring at a compressed condition, which method comprises the steps of:
   a) determining a desired compressed coil spring profile with desired non-constant pitch and radius distributions at a compressed condition;
   b) choosing an initial uncompressed coil spring profile for FEA (Finite Element Analysis) input model;
   c) compressing the uncompressed coil spring profile using FEA to obtain a compressed coil spring profile;
   d) subtracting the difference in pitch and radius distributions between the desired compressed coil spring profile in step a) and the compressed coil spring profile in step c) from the initial uncompressed coil spring profile in step b) to provide an updated uncompressed coil spring profile, with adjusting a free height of the uncompressed coil spring profile to meet a load requirement;
   e) repeating steps c) and d) after substituting the updated uncompressed coil spring profile for the uncompressed coil spring profile in step c) until a maximum difference in pitch and radius is smaller than a predetermined tolerance, and providing a corresponding compressed coil spring profile;
   f) comparing a force line position of the compressed coil spring profile produced in step e) with a force line position target;
   g) repeating steps c) and f) after making an adjustment to the previously uncompressed coil spring profile until the force line position in step f) is within acceptable tolerances; and
   h) repeating steps c)-g) until the corresponding compressed coil spring profile in step c) is within acceptable tolerances of the desired compressed coil spring profile determined in step a) and the force line position in step f) is within acceptable tolerances, thereby obtaining an uncompressed coil spring shape.

2. A computerized method of designing an uncompressed coil spring shape for quasi-static use according to claim 1, wherein one or more of spring rate, load, force line position, stress and deformed profile of the coil spring are determined.

3. A computerized method of designing an uncompressed coil spring shape for quasi-static use according to claim 2, wherein coil-to-coil clearance, bowing, and space interference of the coil spring design are determined.

4. A computerized method of designing an uncompressed coil spring shape for quasi-static use according to claim 1, wherein adjustment of the compressed coil spring profile to the desired compressed coil spring profile preformed in steps c)-e) is performed separately from adjustment of the force line position of the compressed coil spring to the force line position target performed in steps c)-g).

5. A computerized method of designing an uncompressed coil spring shape for quasi-static use according to claim 1, wherein adjustment of the compressed coil spring profile of the coil spring to the compressed coil spring profile of the desired compressed coil spring and adjustment of the force line position of the compressed coil spring to the force line position target are each performed alternatively.

6. A computerized method of designing an uncompressed coil spring shape for quasi-static use according to claim 1, wherein adjusting the compressed coil spring profile of the coil spring to the compressed coil spring profile of the desired compressed coil spring comprises an adjustment for differences in height and radius and an adjustment for load.

7. A computerized method of designing an uncompressed coil spring shape for quasi-static use according to claim 1, wherein an uncompressed coil spring profile to move the force line position of the compressed coil spring to the force line position target is adjusted by subtracting a difference in profiles between before and after applying a seat inclination testing.

8. A computerized method of designing an uncompressed coil spring shape for quasi-static use according to claim 7, wherein said seat inclination testing determines necessary seat inclination to move a force line position to target by linear combination of each force line position movement due to unit inclination of upper and lower seats about one or more axes.

9. A computerized method of designing an uncompressed coil spring shape for quasi-static use according to claim 1, wherein the initial uncompressed coil spring profile has a predetermined height, number of turns and wire diameter and the method further comprises the step of adjusting at least one of the number of turns and wire diameter.

10. A coil spring for quasi-static use having in an uncompressed condition a non-constant coil radius distribution and a non-constant pitch distribution, said coil spring designed by a computerized method that comprises:
   a) determining a desired compressed coil spring profile with desired non-constant pitch and radius distributions at a compressed condition;

b) choosing an initial uncompressed coil spring profile for FEA (Finite Element Analysis) input model;

c) compressing the uncompressed coil spring profile using FEA to obtain a compressed coil spring profile;

d) subtracting the difference in pitch and radius distributions between the desired compressed coil spring profile in step a) and the compressed coil spring profile in step c) from the initial uncompressed coil spring profile in step b) to provide an undated uncompressed coil spring profile, with adjusting a free height of the uncompressed coil spring profile to meet a load requirement;

e) repeating steps c) and d) after substituting the updated uncompressed coil spring profile for the uncompressed coil spring profile in step c) until a maximum difference in pitch and radius is smaller than a predetermined tolerance, and providing a corresponding compressed coil spring profile;

f) comparing the force line position of the compressed coil spring profile with a force line position target;

g) repeating steps c) and f) after making an adjustment to the previously uncompressed coil spring profile until the force line position in step f) is within acceptable tolerances; and h) repeating steps c)-g) until the corresponding compressed coil spring profile in step c) is within acceptable tolerances of the desired compressed coil spring profile determined in step a) and the force line position in step f) is within acceptable tolerances.

11. A coil spring according to claim 10, wherein the coil spring has a non-parameterizable curvature of the coil centerline.

* * * * *